United States Patent [19]

Heide

[11] Patent Number: 4,679,240

[45] Date of Patent: Jul. 7, 1987

[54] TOUCH SENSITIVE HEARING AID VOLUME CONTROL CIRCUIT

[75] Inventor: Jorgen Heide, Cordoba, Tenn.

[73] Assignee: Richards Medical Company, Memphis, Tenn.

[21] Appl. No.: 723,579

[22] Filed: Apr. 15, 1985

[51] Int. Cl.$^4$ ............ H04R 25/02; H04R 25/00; H03G 3/72

[52] U.S. Cl. .................. 381/68.6; 307/493; 328/168; 328/172; 381/68; 381/69; 381/104; 381/109; 381/120

[58] Field of Search .............. 179/107 E, 107 R; 381/68, 69, 104, 107, 109, 120, 68.6; 328/168, 172; 207/308, 493

[56] References Cited

U.S. PATENT DOCUMENTS

| | | | |
|---|---|---|---|
| 3,596,109 | 7/1971 | Marshall | 307/242 |
| 3,764,748 | 10/1973 | Branch et al. | 179/107 E |
| 4,068,090 | 1/1978 | Komatsu et al. | 179/107 R |
| 4,385,204 | 5/1983 | Wine | 381/109 |
| 4,471,490 | 9/1984 | Bellafiore | 381/69 |
| 4,490,585 | 12/1984 | Tanaka | 179/107 FD |
| 4,539,440 | 9/1985 | Sciarra | 179/107 E |
| 4,560,838 | 12/1985 | Meisenheimer | 381/107 |

OTHER PUBLICATIONS

Moore, Stephen, "Control Analog Signals with Voltage", *Electronic Design*, Jul. 19, 1978, vol. 26, No. 15, pp. 68–73.

Istvan, N. "Touch Control", *Wireless World*, Nov. 1980, vol. 86, No. 1538, p. 84.

Primary Examiner—Gene Z. Rubinson
Assistant Examiner—Danita R. Byrd
Attorney, Agent, or Firm—Pravel, Gambrell, Hewitt & Kimball

[57] ABSTRACT

A touch sensitive electronic volume control circuit so that the gain of an amplifier can be changed to any level from zero to maximum and the gain can be retained for periods of time without user adjustment or for power supply replacement.

25 Claims, 3 Drawing Figures

TOUCH SENSITIVE HEARING AID VOLUME CONTROL CIRCUIT

BACKGROUND OF THE INVENTION

1. Field of the Invention

The present invention relates to volume control circuits and, more particularly, to a touch sensitive volume control circuit that is adapted for use in the small confines of a hearing aid.

2. Description of the Prior Art

Touch sensitive control systems are widely available today. They are used in microwave ovens, elevator buttons and remote controls. There are several variations that are used for volume control. One variation uses electronics to control a relay that activates a motor, which in turn adjusts an electromechanical volume control. Many other volume control systems are purely electronic and use complex circuits employing pulse width modulation techniques or electronic counters to set and hold the loudness level at a desired setting. The microwave oven touch sensors are generally for digital control, having only off and on functions, and are not designed to provide continuously variable level control.

Prior art circuits generally have a complex design with a complicated configuration of component parts, requiring them to occupy a relatively large space and consume high amounts of power. Such systems are not capable of being fitted within small spaces as necessary for use in conjunction with a hearing aid, and are not able to operate for long periods of time from a battery.

One example of a prior art touch sensitive control circuit is taught in U.S. Pat. No. 3,691,298 where the circuit uses the touch of a finger to charge a capacitor connected to the gate of a field effect transistor (FET). The drain of the FET is connected to the positive terminal of a power supply. The source of the FET is connected to a resistor that is connected to ground. Varying the gate voltage varies the drain to source resistance of the FET. This change in resistance causes a change in the voltage across the resistor connected to ground. The resistor voltage is used to set the gain for an amplifier circuit.

However, the use of a voltage to control an amplifier's gain does not adequately provide accurate touch sensitive volume control for miniaturized applications or where power requirements are low such as use in a hearing aid. This is because the amplifiers used in the patented circuit require more space than a hearing aid will allow and have higher power requirements and supply voltage limits than available in hearing aids.

SUMMARY OF THE INVENTION

The circuit of the present invention uses a novel design that is adapted for use in a small space and with relatively low power requirements and, at the same time, significantly reduces the number of parts heretofore used to perform the touch sensitive electronic volume control function. The invention embodies the concept that a field effect transistor (FET) can operate as a voltage variable resistor. Appropriate placement of such a variable resistor in the gain control circuitry of an amplifier makes it possible to control the volume of a device such as a hearing aid through the simple procedure of touching a portion of the circuit.

The source of the FET is connected to a negative supply voltage, either directly or capacitively coupled, and the drain is connected to the gain control input of an amplifier, again either directly or capacitively. The amplifier circuitry is designed to set the amplifier gain based on the impedance connected to the gain control input. As the impedance at the gain control input increases the amplifier gain decreases. A voltage control capacitor is mounted between the gate of the FET and the negative supply voltage.

If the charge on the voltage control capacitor is increased, the voltage applied to the gate of the FET is also increased, thereby reducing the drain to source resistance of the FET. This reduced resistance, in turn, signals an increased gain in the amplifier circuit. When the charge on the voltage control capacitor decreases, the voltage at the gate of the FET decreases and the resistance between the drain and the source of the FET increases, causing a reduced gain in the amplifier.

An increase or decrease in the charge stored on the voltage control capacitor is accomplished by touching a set of contacts that are connected between the gate of the FET and the positive supply voltage or the gate of the FET and the negative supply voltage, respectively. Placing a finger across the contact set connected to the positive supply voltage allows current to flow from the positive supply voltage through the finger and to the capacitor for charging. A finger placed across the other contact set forms a discharge circuit from the capacitor to ground through the resistance of the finger.

The circuit of the present invention has relatively few parts and is simple in design, allowing it to occupy a small space and have low power requirements. These features make the circuit ideal for use in hearing aids or other devices where volume control circuits need to be relatively small. The circuit has the additional advantage that the battery or other power source for supplying power to the circuit may be removed for periods of time without any change in the desired volume level.

BREIF DESCRIPTION OF THE DRAWINGS

A better understanding of the invention can be obtained when the detailed description of exemplary embodiments set forth below is considered in conjunction with the following drawing, in which.

DETAILED DESCRIPTION OF EXEMPLARY EMBODIMENTS

Figure 1:
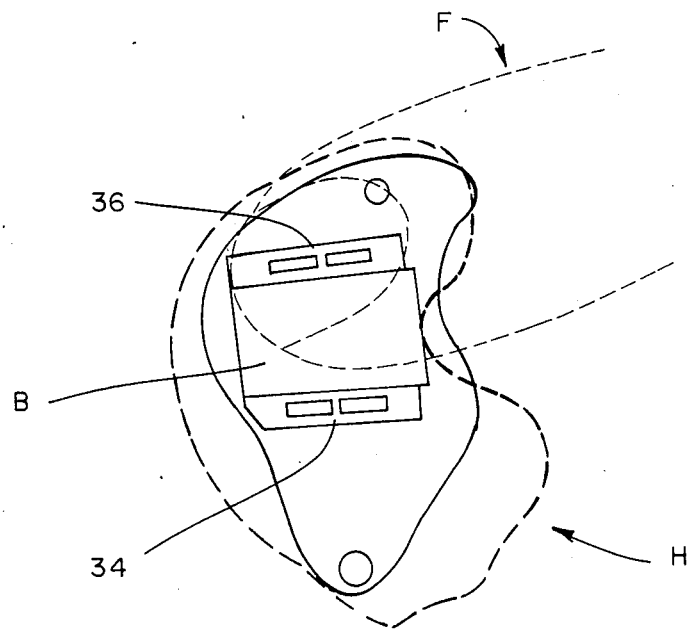
FIG. 1 is a perspective view of an in-the-ear hearing aid in situ, of the type in which the volume control circuit of the present invention can be used.

Referring to FIG. 1, the letter E generally identifies a human ear and the letter H a hearing aid containing a circuit of the present invention, although it should be kept in mind that the miniaturized circuit can be adapted for use in any device where space is limited. The hearing aid H is of the style that fits totally within the cavity of the outer ear. The broken lines identified as H1 show the contour of the hearing aid H within the cavity, while the solid line H2 shows the exposed portion of a typical in-the-ear hearing aid H.

The hearing aid H is powered by a battery 20 (see FIGS. 2 and 3) that is contained in a compartment B (FIG. 1). Contact sets 34, 36 are provided so that the wearer can regulate the volume of the hearing aid H simply by touching one of the contacts 34, 36, as described in greater detail below. A finger, shown superimposed by dotted lines identified by letter F, is shown touching contact set 36 in FIG. 1, to illustrate how volume can be controlled for the hearing aid H.

Figure 2:
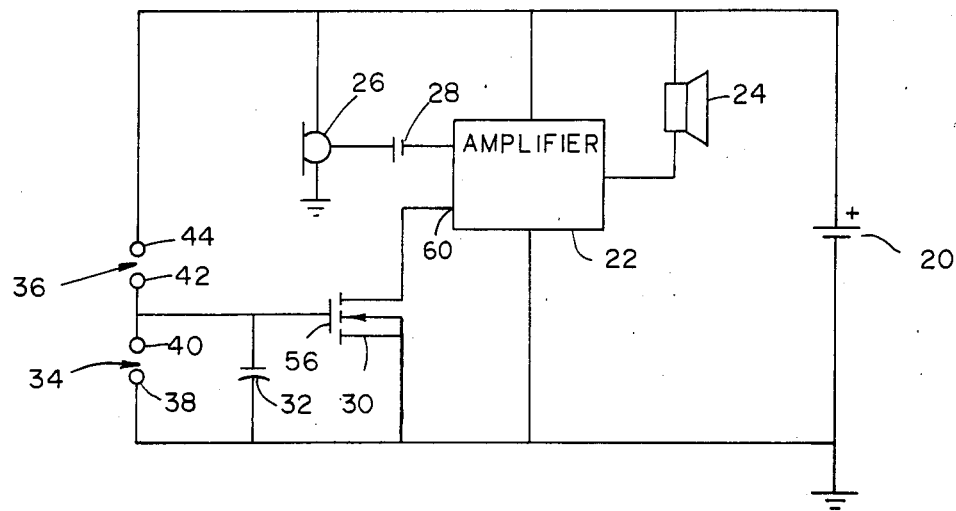
FIG. 2 is an electrical schematic diagram of one embodiment of a circuit designed according to the present invention.

Referring to FIG. 2, an input transducer or receiver microphone 26 of known design receives sound waves and transforms them into a corresponding electrical signal. This signal is filtered by a capacitor 28 for removing direct current components of the signal. An amplifier 22 amplifies the filtered sound waves and transmits a signal to an output transducer or speaker 24 that reproduces the received sound and transmits it to the wearer of the hearing aid H at the desired level.

A field effect transistor (FET) 30, with the drain connected to the gain control input 60 of the amplifier 22 and the source connected to ground is provided to supply a gain control signal to the amplifier 22. This is done because the FET 30 is operated below the pinch-off voltage so that the resistance from the drain to the source of the FET 30 is operated in a linear region controlled by the gate to source voltage. By changing the voltage applied to the gate 56 of the FET 30, it is possible to change the drain to source resistance of the FET 30. This change in drain to source resistance of the FET 30 causes a change in the gain of the amplifier 22. This is because the gain control input 60 of the amplifier 22 is designed to respond to a connected impedance to set the amplifier gain level. Further, increasing the impedance connected to the gain control input 60 reduces the gain of the amplifier 22 while reducing the connected impedance increases the amplifier 22 gain.

A capacitor 32 connected between the gate 56 and ground is used to maintain the desired voltage on the gate 56. The charge retained on the capacitor 32 is changed by touching either the contact set 34 or the contact set 36. For the contact set 34, if a finger is placed from a contact 38 to a contact 40 a path is formed allowing the capacitor 32 to discharge through the contact set 34 to ground. The finger operates as a large value resistor, generally 4–5 MΩ, thereby creating the discharge path. This discharge path reduces the voltage applied to the gate 56, which increases the drain to source resistance of the FET 30. This increased resistance reduces the gain of the amplifier 22.

For the contact set 36, if a finger is placed between contacts 42, 44, the charge stored on capacitor 32 is increased by supplying charge from the battery 20 and thereby increasing the voltage applied to the gate 56. This increased gate voltage operates to reduce the drain to source resistance of the FET 30, which in turn increases the gain or amplification of the amplifier 22.

The contacts 38–44 are formed of conductive materials generally well known such as, for example, aluminum or gold. By touching the appropriate contact set 34, 36 the voltage applied to the gate 56 of the FET 30 can be set at any voltage between zero and that of the battery 20. This allows a continuous gain control signal to be generated that has no discrete steps.

The capacitor 32 is preferably a low leakage capacitor used in conjunction with a very high input resistance FET 30 so that the charge stored on the capacitor 32 remains for a period of time and does not leak away rapidly. For a hearing aid the preferable charge storage period is 18 to 24 hours. This allows the desired volume level of the speaker 24 to be retained for a longer period of time without user adjustment. The value of the capacitor 32 can be varied to compensate for differing FET 30 and capacitor 32 leakages and to change the nominal volume level retention time. For an improved input resistance and a lower leakage, the FET 30 is preferably a MOSFET as shown in FIG. 2.

Figure 3:
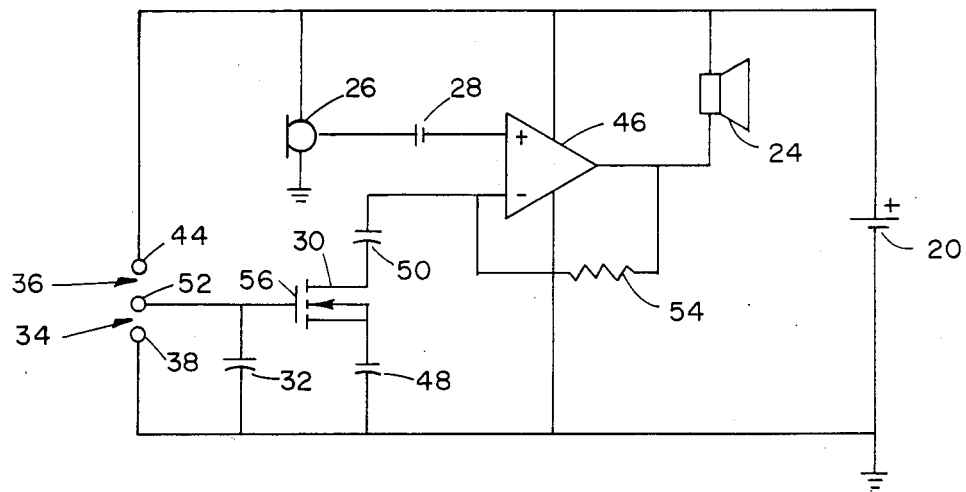
FIG. 3 is an electrical schematic diagram of a second embodiment of a circuit designed according to the present invention.

With the configuration shown in FIGS. 2, 3, the battery 20 can be removed for extended periods of time without a change in the gain control level because the component storing the desired gain information, the capacitor 32, is not an active device and so retains a charge without the battery 20 or an equivalent power source being present. The reduced number of parts that form the circuit of FIG. 2 allows it to be small in size, especially if the components are in unpackaged or chip form, which makes the circuit especially suitable for use in hearing aids of the type shown in FIG. 1.

FIG. 3 shows a second embodiment designed for volume control of AC signals. This circuit includes an amplifier 46 that is a low voltage, low power operational amplifier in a noninverting configuration. Instead of connecting the FET 30 directly to the amplifier 46 and to ground as was the case for the embodiment of FIG. 2, the FET 30 is coupled via capacitors 48, 50. This coupling allows the gain control to be frequency dependent in addition to being dependent on the FET 30 drain to source resistance. The overall impedance of the circuit from the inverting input of the amplifier 46 to the negative supply voltage varies depending upon the frequency of the signal being amplified and the voltage applied to the gate 56 the of FET 30. By varying the values of the capacitors 48, 50 in relation to the feedback resistor 54 and the FET 30, the frequency characteristics of the gain control are optimized for the given application.

The contact sets 34, 36 have also been reconfigured in FIG. 3 so that a common contact 52 is used instead of the individual contacts 40, 42. This change allows the use of less contact material, therefore requiring less space than the contact arrangements shown in FIG. 1.

A resistor 58 has been connected from the source of the FET 30 to the positive terminal of the battery 20. This is done to allow a broader selection of FET's to be used in very low voltage situations. The variations in the gate to source voltage necessary for cut-off of the FET are very large. A large number of unscreened parts do not perform correctly at 1.2 v. The addition of the resistor 58 provides a biasing effect, reducing the actual voltage necessary to be applied to the gate 56 to bring the FET 30 into the cut-off region. This allows the use of a larger selection of FET's when the circuit is used in a very low voltage environment.

The embodiments of the volume circuit described above are suitable for use in environments where there are small space or low power consumption requirements. The embodiments of FIGS. 2 and 3, are especially suitable for hearing aids where a small battery can be used as a power source and the volume can be raised or lowered simply by touching the instrument. This feature enables the volume level to be adjusted without removing the hearing aid from the ear or manipulating small knobs or buttons. Further, the battery can be changed without having to reset the volume level.

It is to be noted that the references to the drain and source of the FET 30 are used for descriptive purposes. The drain and source as designated by the manufacturer of the FET can be reversed so that (a) the designated source is connected to ground and the designated drain is connected to the gain control input 60 or (b) the designated source is connected to the gain control input 60 and the designated drain is connected to ground.

The foregoing disclosure and description of the invention are illustrative and explanatory of the invention, and various changes in the size, shape and materials, as well as in the details of the illustrated construction may be made without departing from the spirit of the invention, all of which are contemplated as falling within the scope of the appended claims.

I claim:

1. A hearing aid, comprising:
   a housing;
   a sound sensing means located in the housing and having an output signal;
   a sound producing means located in the housing and having a signal input;
   an amplifier located in the housing and having a gain control input responsive to a change in the impedance connected to the gain control input, a signal input and an amplified signal output, with the sensing means output signal connected to the signal input and the amplified signal output connected to the producing means signal input;
   a direct current voltage source located in the housing and having a positive and a negative terminal
   a field effect transistor having a gate, a source and a drain located in the body, the source being coupled to one of (a) the negative terminal of the voltage source or (b) the gain control input of the amplifier and the drain being correspondingly coupled to the other of (a) the negative terminal of the voltage source or (b) the gain control input of the amplifier;
   a first capacitor located in the housing and connected between the gate and the negative terminal of the voltage source;
   a first and a second contact set, each contact set being mounted on the housing and comprising at least two conductive contacts spaced sufficiently close to be bridged by touch, the first contact set being connected between the gate and the negative terminal of the voltage source and the second contact set being connected between the gate and the positive terminal of the voltage source so that when the first contact set is touched the impedance from the drain to the source of the transistor increases and when the second contact set is touched the transistor drain to source impedance decreases.

2. The hearing aid of claim 1, wherein the amplifier gain increases as the impedance connected to the gain control input decreases and the gain decreases as the impedance connected to the gain control input increases.

3. The hearing aid of claim 1, wherein the source is directly connected to the negative terminal of the voltage source and the drain is directly connected to the gain control input.

4. The hearing aid of claim 1, wherein the source is capacitively coupled to the negative terminal of the voltage source and the drain is capacitively coupled to the gain control input.

5. The hearing aid of claim 3 or 4 wherein continuous touching of the first contact set produces a continuous increase in the transistor drain to source impedance and wherein continuous touching of the second contact set produces a continuous decrease in the transistor drain to source impedance.

6. The hearing aid of claim 3 or 4, wherein the transistor is a MOSFET.

7. The hearing aid of claim 3 or 4, wherein the first capacitor is a low leakage capacitor.

8. The hearing aid of claim 1 wherein continuous touching of the first contact set produces a continuous increase in the transistor drain to source impedance and wherein continuous touching of the second contact set produces a continuous decrease in the transistor drain to source impedance.

9. The hearing aid of claim 1, wherein the transistor is a MOSFET.

10. The hearing aid of claim 1, wherein the first capacitor is a low leakage capacitor.

11. The hearing aid of claim 1, wherein the source is directly connected to the gain control input and the drain is directly connected to the negative terminal of the voltage source.

12. The hearing aid of claim 1, wherein the source is capacitively coupled to the gain control input and the drain is capacitively coupled to the negative terminal of the voltage source.

13. A touch sensitive volume control circuit, comprising:
   a direct current voltage source having a positive and a negative terminal;
   an amplifier having a gain control input responsive to an impedance connected to the gain control input;
   a field effect transistor having a gate, a source and a drain, the source being selectively coupled to one of (a) the negative terminal of the voltage source or (b) the gain control input and the drain being correspondingly coupled to the other of (a) the negative terminal of the voltage source or (b) the gain control input;
   a first capacitor connected between the gate and the negative terminal of the voltage source;
   a first and a second contact set, each contact set comprising two conductive contacts spaced sufficiently close to be bridged by touch, the first contact set being connected between the gate and the negative terminal of the voltage source and the second contact set being connected between the gate and the positive terminal of the voltage source so that when the first contact set is touched the impedance from the drain to the source of the transistor is increased and when the second contact set is touched the transistor drain to source impedance is decreased.

14. The circuit of claim 13, wherein the source is directly connected to the negative terminal of the voltage source and the drain is directly connected to the gain control input.

15. The circuit of claim 13 wherein the source is capacitively coupled to the negative terminal of the voltage source and the drain is capacitively coupled to the gain control input.

16. The hearing aid of claim 14 or 15, wherein continuous touching of the first contact set produces a continuous increase in the transistor drain to source impedance and wherein continuous touching of the second contact set produces a continuous decrease in the transistor drain to source impedance.

17. The circuit of claim 14 or 15, wherein the field effect transistor has a high input impedance.

18. The circuit of claim 17, wherein the transistor is a MOSFET.

19. The circuit of claim 14 or 15, wherein the first capacitor is a low leakage capacitor.

20. The hearing aid of claim 13, wherein continuous touching of the first contact set produces a continuous increase in the transistor drain to source impedance and wherein continuous touching of the second contact set produces a continuous decrease in the transistor drain to source impedance.

21. The circuit of claim 13, wherein the field effect transistor has a high input impedance.

22. The circuit of claim 21, wherein the transistor is a MOSFET.

23. The circuit of claim 13, wherein the first capacitor is a low leakage capacitor.

24. The circuit of claim 13, wherein the source is directly connected to the gain control input and the drain is directly connected to the negative terminal of the voltage source.

25. The circuit of claim 13, wherein the source is capacitively coupled to the gain control input and the drain is capacitively coupled to the negative terminal of the voltage source.

* * * * *